United States Patent
Gao et al.

(10) Patent No.: US 6,861,712 B2
(45) Date of Patent: Mar. 1, 2005

(54) MOSFET THRESHOLD VOLTAGE TUNING WITH METAL GATE STACK CONTROL

(75) Inventors: Wei Gao, Vancouver, WA (US); Yoshi Ono, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/345,744

(22) Filed: Jan. 15, 2003

(65) Prior Publication Data

US 2004/0137703 A1 Jul. 15, 2004

(51) Int. Cl.$^7$ .......................... H01L 29/76; H01L 29/94; H01L 31/062; H01L 31/113; H01L 31/119
(52) U.S. Cl. ........................................ 257/369; 257/407
(58) Field of Search ............................... 257/368, 369, 257/388, 392, 406, 407

(56) References Cited

U.S. PATENT DOCUMENTS 6,410,376 B1 * 6/2002 Ng et al. .................... 438/199

OTHER PUBLICATIONS

Qiang Lu, Ronald Lin, Pushkar Ranade, Tsu–Jae King, Chenming Hu; Metal Gate Work Function Adjustment for Future CMOS Technology, VLSI tech.

Igor Polishchuk, Pushkar Ranade, Tsu–Jae King and Chenming Hu, Dual Work Function Metal Gate CMOS Technology Using Metal Interdiffusion. IEEE Electron Device Letters, 22 (2001) 444.

* cited by examiner

Primary Examiner—Hoai Pham
(74) Attorney, Agent, or Firm—David C. Ripma; Matthew D. Rabdau; Joseph P. Curtin

(57) ABSTRACT

A stacked metal gate MOSFET and fabrication method are provided. The method comprises: forming a gate oxide layer overlying a channel region; forming a first metal layer having a first thickness overlying the gate oxide layer; forming a second metal layer having a second thickness overlying the first metal layer; and, establishing a gate work function in response to the combination of the first and second thicknesses. In one example, the first metal layer has a thickness of less than about 1.5 nanometers (nm) the second metal layer has a thickness greater than about 10 nm. Then, establishing a gate work function includes establishing a gate work function substantially in response to the second metal second thickness. Alternately, the first metal thickness is greater than about 20 nm. Then, the gate work function is established substantially in response to the first metal thickness.

26 Claims, 4 Drawing Sheets

US 6,861,712 B2

MOSFET THRESHOLD VOLTAGE TUNING WITH METAL GATE STACK CONTROL

BACKGROUND OF THE INVENTION

1. Field of the Invention

This invention generally relates to CMOS fabrication processes and, more particularly, to a CMOS device that uses a stacked metal gate to control gate work functions and transistor threshold voltages.

2. Description of the Related Art

The threshold voltages (Vth) of the NMOS and PMOS components in a complementary metal oxide semiconductor (CMOS) circuit largely dictate the speed, standby current, and operating current performance characteristics. The Vth must be set to maximize the "on" current, while minimizing the "off" current. Usually this is a trade off that is determined by the circuit design and application. Typically, the Vth is adjusted through fine tuning of the doping level in the channel region of the transistors with a Vth adjust implant. As the feature size of transistors continues to scale down, the struggle to minimize short channel effects, and reduce punchthrough and drain-induced barrier lowering with implantations and anneals, ultimately limit the device speed.

As an alternative to adjusting Vth, the work function of the gate can be controlled. This is usually done with implants into the gate polysilicon, where donor type dopant is placed in the gate for NMOS, and acceptor dopants into PMOS gates. The use of doped polysilicon gates presents a different set of problems, however. Dopant diffusion, through the gate dielectric into the channel, affects the Vth and polysilicon depletion near the gate dielectric, and limits the performance of the transistors. This diffusion problem is addressed with the use of metal gate materials.

With metal gate technologies, the choice of an appropriate work function material is necessary for the N and P MOSFETs. Work function is the energy required to remove an electron from the Fermi level to vacuum. The work function of different materials, and even different metals, varies. Since the NMOS and PMOS work function requirements are different, the metal materials are typically different.

Conventional fabrication processes have employed the use of either channel implants combined with the choice of polysilicon, or metal gate material. Thus, the work function of the gate has been dictated by the choice of the gate metal material. The fabrication of different gate work functions on the same wafer, such as is required for complementary NMOS and PMOS transistors, has required different gate materials. However, the use of completely different metal materials for use in the NMOS and PMOS gates results in additional fabrication steps and undesired complexity.

It would be advantageous if common metal materials could be used in both the PMOS and NMOS gates of a CMOS device.

It would be advantageous if different work functions could be created using the same gate metal materials.

SUMMARY OF THE INVENTION

This present invention permits the fine tuning of a transistor Vth in response to adjusting the thicknesses of metal in a dual metal stack on a gate dielectric. By tailoring the bottom metal thickness of a dual metal gate stack for example, the work function of the gate can be varied between the value of one metal, to that of the other metal.

Accordingly, a method is provided for setting a threshold voltage in a MOSFET transistor with a metal gate stack. The method comprises: forming a gate oxide layer overlying a channel region; forming a first metal layer having a first thickness overlying the gate oxide layer; forming a second metal layer having a second thickness overlying the first metal layer; and, establishing a gate work function in response to the combination of the first metal first thickness and the second metal second thickness.

In one example, forming a first metal layer includes the first thickness being less than about 1.5 nanometers (nm), and forming a second metal layer includes the second thickness being greater than about 10 nm. Then, establishing a gate work function includes establishing a gate work function substantially in response to the second metal second thickness. Alternately, forming a first metal layer includes the first thickness being greater than about 20 nm. Then, establishing a gate work function includes establishing a gate work function substantially in response to the first metal first thickness.

Stated yet another way, forming a first metal layer includes the first metal having a low work function, and forming a second metal includes the second metal having a high work function. Then, establishing a gate work function includes establishing a gate work function in response to the combination of the high and low work functions. Alternately, the first metal layer can have a high work function and the second metal layer can have a low work function.

Additional details of the above-described method and a MOSFET device with a dual metal gate are provided below.

DETAILED DESCRIPTION OF THE PREFERRED EMBODIMENTS

Figure 1:
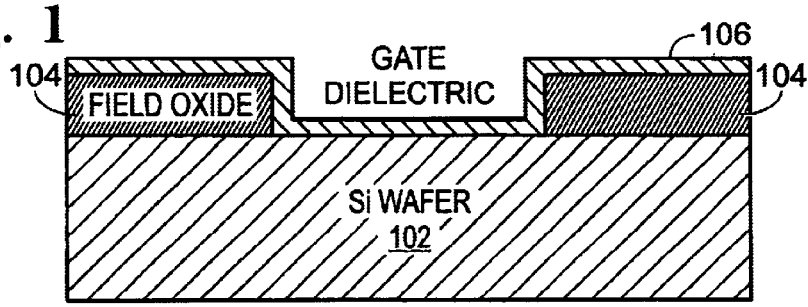
FIGS. 1 through 5 illustrate steps in the process of completing the present invention metal gate stack MOSFET.

FIGS. 1 through 5 illustrate steps in the process of completing the present invention metal gate stack MOSFET. FIG. 1 is a partial cross-sectional view of the present invention MOSFET 100 prior to gate fabrication. Prior to depositing the desired dual metal gate, the MOSFET structure is formed by any state of the art method. An example is shown illustrating a gate replacement process. However, the present invention process is also applicable to a self-aligning gate process. Shown is a silicon (Si) substrate 102, field oxide regions 104, and a gate dielectric 106 overlying the substrate 102 and the field oxide regions 104. The gate dielectric can be any kind of conventional material that can be deposited or grown.

Figure 2:
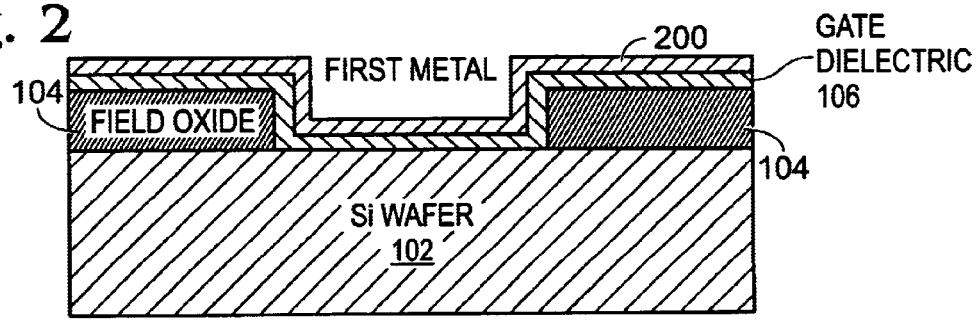

FIG. 2 is a partial cross-sectional view of the MOSFET of FIG. 1, following the deposition of a first metal layer. A thin layer of the first metal 200 (or other gate material) of desired thickness, e.g., 50 Å, is deposited by any state of the art method. Depending upon the design of the structure, the composition of the thin film can be an elemental film such as W, Ti, or Ta, binary materials such as Ta—N or Ti—N, or compounds consisting of more than two elements. The present invention is not limited to any particular list of materials.

Figure 3:
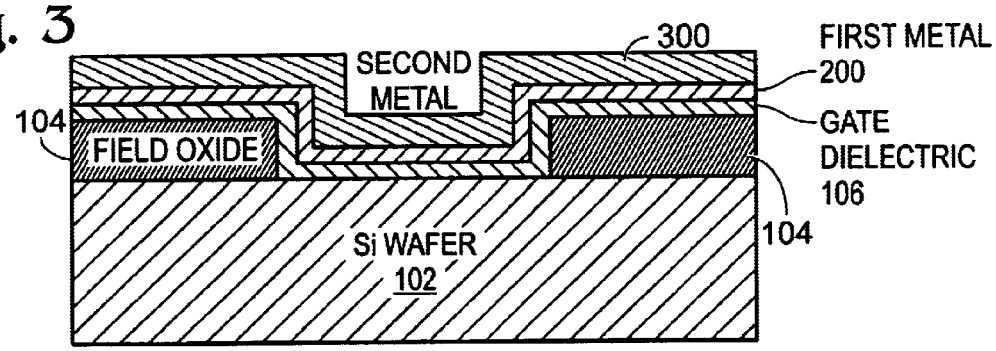

FIG. 3 is a partial cross-sectional view of the MOSFET of FIG. 2, following the deposition of a second metal layer. A layer of the second metal 300 (or other gate material) of desired thickness, e.g. 2000 Å is deposited by any state of the art method. Depending upon the design of the structure, the composition of the thin film can be an elemental film such as Al, Pt, or Cu, binaries such as W—N or Ti—N, or compounds or more than two elements. Again, the invention is not limited to any particular materials.

Figure 4:
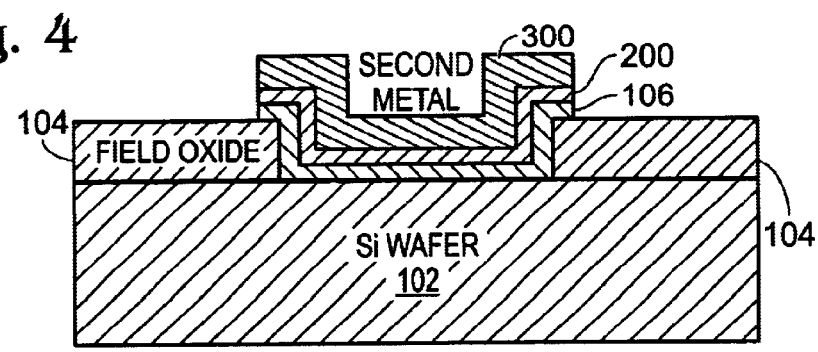

FIG. 4 is a partial cross-sectional view of the MOSFET of FIG. 3, following an etching process. The metal stack 200/300 is either etched or chemical-mechanically polished (CMP'd) to form the metal gate stack as desired. The resultant structure can then be treated thermally, electrically, or mechanically as required.

Figure 5:
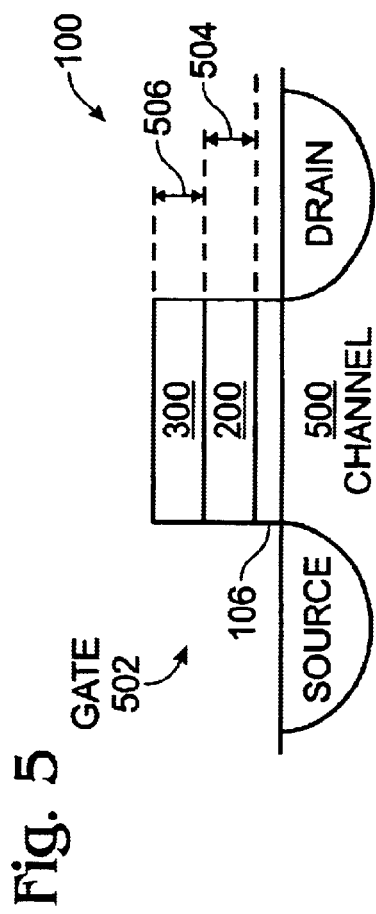

FIG. 5 is a partial cross-sectional view of the completed MOSFET. The MOSFET 100 comprises a silicon channel region 500 and the gate oxide layer 106 overlying the channel region 500. A gate 502 includes the first metal layer 200 having a first thickness 504 overlying the gate oxide layer 106. The second metal layer 300, non-diffused with the first metal layer 200, has a second thickness 506 overlying the first metal layer 200. The gate 502 has a gate work function responsive to the first metal first thickness 504 and the second metal second thickness 506.

As used herein, the term "non-diffused" is intended to mean that the two metal layers are not intentionally diffused by an annealing process, for example, an annealing process that insures that the two metals are fully mixed—reaching an equilibrium state. Generally speaking, metals do diffuse when they contact. However in some circumstance, like with a compound/metal such as TiN/Pt is used, an insignificant amount of diffusion may occur. Overlying metals with an insignificant amount of diffusion are still considered to be non-diffused. Alternately stated, when metal combinations such as Ti/Pt are used, where a small degree of diffusion is inevitable, this partial diffusion does not contradict the more general non-diffused state of the metals. In some aspects, an interfacial layer may be formed between two metal layers in which the composition is changing. Then, there exist two layers of non-diffused metal, with an interfacial layer formed from a small portion of the non-diffused metal stack thickness.

In some aspects of the MOSFET, the first metal layer first thickness 504 is less than about 1.5 nanometers (nm) and the second metal second thickness 506 is greater than about 10 nm. The words "about" or "approximately" are used to describe these thicknesses (and other thicknesses, below) in recognition of convention IC fabrication tolerances. In the above example, the gate work function is substantially responsive to the second metal second thickness, as the first metal first thickness is considered relatively thin. As used herein, the term "substantially" means primarily. For example, if the gate work function is substantially responsive to the second metal second thickness, then relatively large changes in the first metal first thickness create relatively small changes in the overall work function. Practically, the first metal layer first thickness 504 is in the range between 0 and 20 nm. When the first metal layer first thickness 504 is greater than about 20 nm, the first thickness is considered relatively thick and the gate work function is substantially responsive to the first metal first thickness.

These are the extreme conditions, where either the first or second metal thickness dominates. When the first metal first thickness 504 is in the range between 1.5 and 20 nm, the work function becomes dependent upon the thicknesses of both the metal layers. This combined effect of the first and second thickness is even more pronounced when the first thickness 504 is in the range between 1.5 and 10 nm.

Generally, Al, Ti, Ta, Hf, Zr, TaN, and equivalent metals have a low work function, while Pt, Ir, Ni, Co, WN, and equivalent metals have a high work function. In some aspects of the MOSFET, the first metal 200 has a low work function and the second metal 300 has a high work function. Then, the gate work function is responsive to the combination of high and low work functions. For example, the first metal 200 can be an elementary metal material such as W, Ti, Ta, or binary metals such as Ta—N or Ti—N. The second metal 300 can be an elementary metal material such as Ir, Pt, or Cu, or binary metals such as W—N and Ti—N. Alternately, the first metal 200 has a high work function and the second metal has a low work function. For example, the second metal 300 can be an elementary metal material such as W, Ti, Ta, or binary metals such as Ta—N or Ti—N. The first metal 200 can be an elementary metal material such as Ir, Pt, or Cu, or binary metals such as W—N and Ti—N. The above list of metals is not an all-inclusive list of possible materials, as other materials could also be used.

Figure 6:
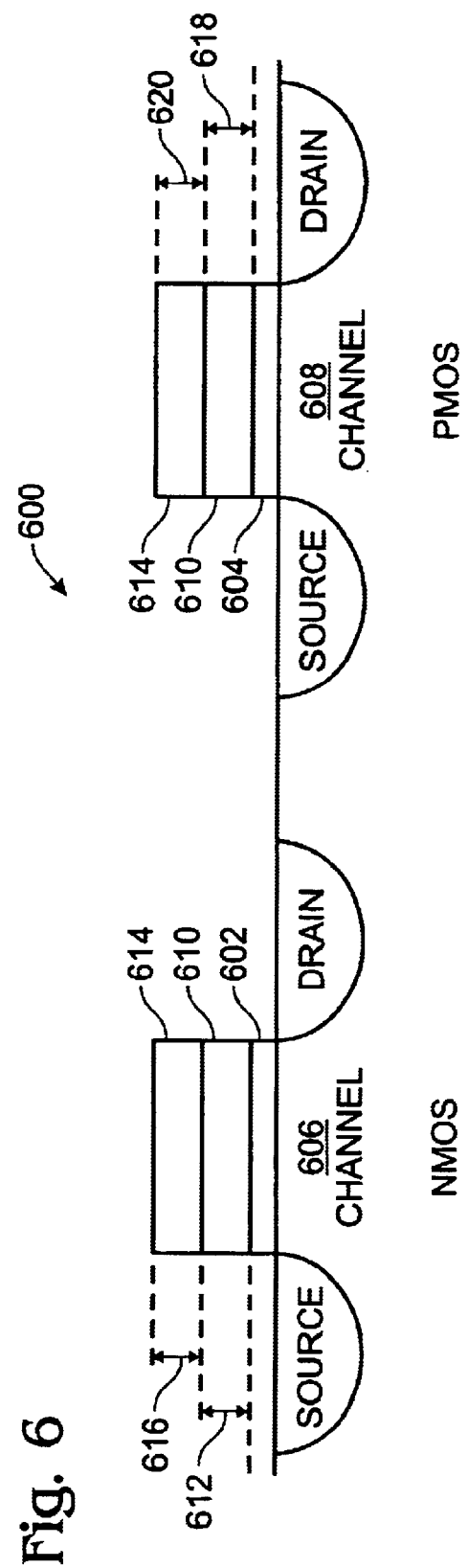
FIG. 6 is a partial cross-sectional view of the present invention dual-gate MOSFET with metal gate stack.

FIG. 6 is a partial cross-sectional view of the present invention dual-gate MOSFET 600 with metal gate stack. The MOSFET 600 comprises gate oxide layers 602/604 overlying NMOS and PMOS channel regions 606/608, respectively. A first metal layer 610, having a first thickness 612, overlies the NMOS gate oxide layer 602. A second metal layer 614, non-diffused into the first metal layer 610, has a second thickness 616 overlying the first metal layer first thickness 612. The NMOS gate work function is responsive to the combination of the first metal first thickness 612 and the second metal second thickness 616.

The first metal layer 610 has a third thickness 618 overlying the PMOS gate oxide layer 604. The second metal layer 614, non-diffused into the first metal layer 610, has a fourth thickness 620 overlying the first metal layer third thickness 618. The PMOS gate work function is responsive to the combination of the first metal third thickness 618 and the second metal fourth thickness 620.

In some aspects, the NMOS gate work function is substantially responsive to the first metal first thickness and the PMOS gate work function is substantially responsive to the second metal fourth thickness. For example, when the first thickness is greater than 20 nm and the third thickness is less than 1.5 nm. Alternately, the NMOS gate work function can be substantially responsive to the second metal second thickness (when the first thickness is less than 1.5 nm for example) and the PMOS gate work function can be substantially responsive to the first metal third thickness (the third thickness is relatively thick, for example, greater than 10 nm).

The first metal 610 can have a low work function and the second metal 614 can have a high work function, so that the NMOS and PMOS gate work functions are responsive to a combination of high and low work functions. For example, the first metal 610 can be an elementary metal such as W, Ti, or Ta, or a binary metal such as Ta—N or Ti—N. The second metal 614 can be an elementary metal such as Al, Pt, or Cu, or a binary metal such as W—N or Ti—N.

Alternatively, the first metal 610 has a high work function, the second metal 614 has a low work function, and the NMOS and PMOS gate work functions are responsive to a combination of high and low work functions. For example, the second metal 614 can be an elementary metal such as W, Ti, or Ta, or a binary metal such as Ta—N or Ti—N. The first metal 610 can be an elementary metal such as Al, Pt, or Cu, or a binary metal such as W—N or Ti—N.

In some aspects, the first metal layer first thickness 612 is less than about 1.5 nm, the second metal layer second thickness 616 is greater than about 10 nm, and the NMOS gate work function is substantially responsive to the second metal second thickness 616. Likewise, when the first metal layer third thickness 618 is less than about 1.5 nm and the second metal layer fourth thickness 620 is greater than about 10 nm, the PMOS gate work function is substantially responsive to the second metal fourth thickness.

In other aspects, the first metal layer first thickness 612 is greater than about 20 nm, and the NMOS gate work function is substantially responsive to the first metal first thickness 612. Likewise, when the first metal layer third thickness 618 is greater than about 20 nm, the PMOS gate work function is substantially responsive to the first metal third thickness 618. Therefore, the work functions of the NMOS and PMOS gates can generally be controlled by the first metal layer first thickness 612 being in the range between 0 and 20 nm and the first metal layer third thickness 618 being in the range between 0 and 20 nm.

Functional Description

Figure 7:
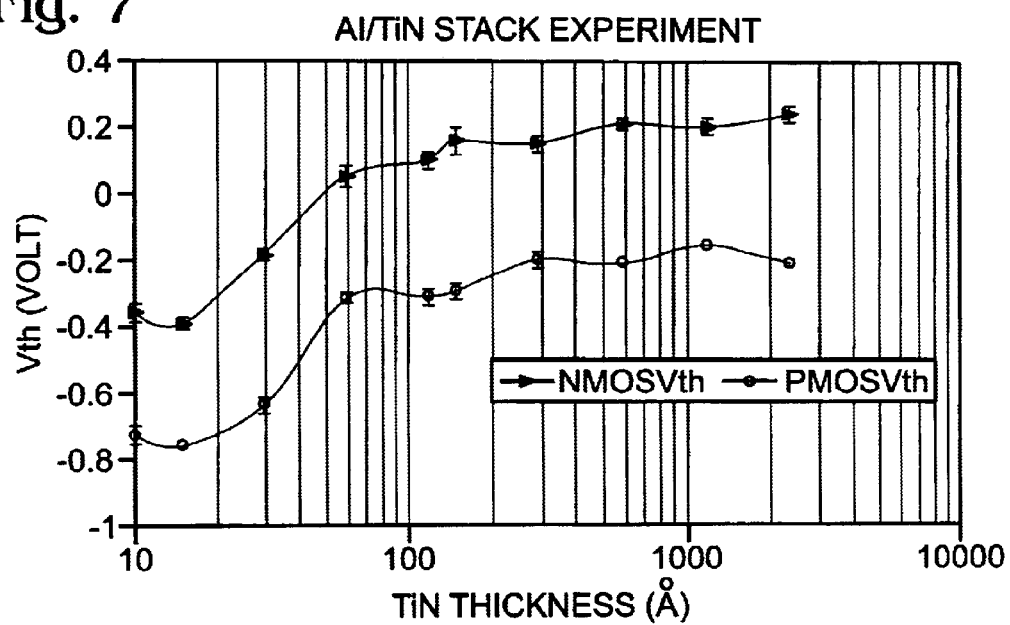
FIG. 7 is graph illustrating the threshold voltage as a function of the first gate metal thickness.

FIG. 7 is graph illustrating the threshold voltage as a function of the first gate metal thickness. Depending on the work function difference between the two metals, the threshold voltage of the transistor can be controlled by adjusting the thickness of the first metal. For example, the gate metal stack can be a TiN/Al stack, where TiN is the first metal. When the TiN is very thin (<1.5 nm), the work function is consistent with a gate composed entirely of Al. As the TiN layer thickness is increased towards 6 nm, the threshold voltage increases. As the TiN layer thickness is increased to over 20 nm, the work function is dominated by the TiN layer, and the threshold voltage is consistent with a metal gate composed entirely of TiN. Therefore, a lower (first) metal thickness of 1 to 10 nm is extremely critical in varying the effective stack work function, making the work function responsive to both the first and second metal layer thicknesses.

Figure 8:
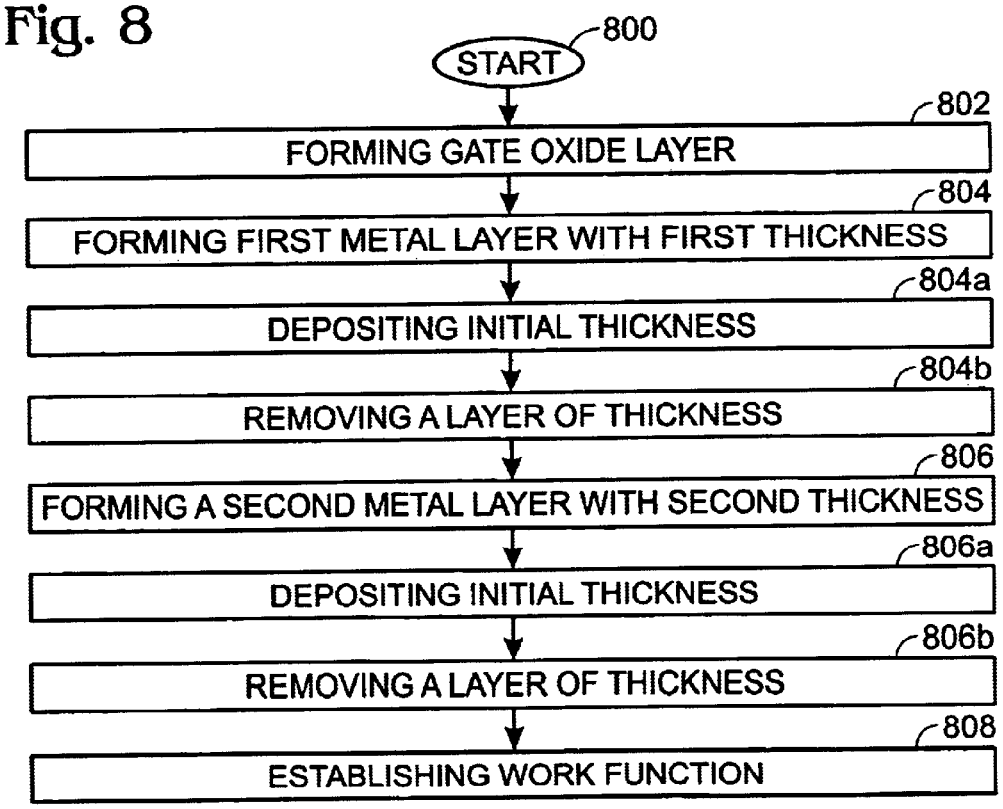
FIG. 8 is a flowchart illustrating the present invention method for setting a threshold voltage in a MOSFET transistor with a metal gate stack.

FIG. 8 is a flowchart illustrating the present invention method for setting a threshold voltage in a MOSFET transistor with a metal gate stack. Although the method (and the method of FIG. 9, below) is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 800.

Step 802 forms a gate oxide layer overlying a channel region. Step 804 forms a first metal layer having a first thickness overlying the gate oxide layer. Step 806 forms a second metal layer having a second thickness overlying the first metal layer. Step 808 establishes a gate work function in response to the combination of the first metal first thickness and the second metal second thickness. In some aspects of the method, establishing a gate work function in response to the combination of the first metal first thickness and the second metal second thickness includes establishing a threshold voltage (Vth).

In some aspects, forming a first metal layer having a first thickness overlying the gate oxide layer in Step 804 includes the first thickness being less than about 1.5 nanometers (nm). Forming a second metal layer having a second thickness overlying the first metal layer in Step 806 includes the second thickness being greater than about 10 nm. Then, establishing a gate work function in response to the combination of the first metal first thickness and the second metal second thickness in Step 808 includes establishing a gate work function substantially in response to the second metal second thickness.

Alternately, forming a first metal layer having a first thickness overlying the gate oxide layer in Step 804 includes the first thickness being greater than about 20 nm. Then, establishing a gate work function in response to the combination of the first metal first thickness and the second metal second thickness in Step 808 includes establishing a gate work function substantially in response to the first metal first thickness. Generally, forming a first metal layer in Step 804 includes forming a first metal first thickness in the range between 0 and 20 nm.

In some aspects, forming a first metal layer in Step 804 includes the first metal having a low work function and forming a second metal layer in Step 806 includes the second metal having a high work function. Then, establishing a gate work function in Step 808 includes establishing a gate work function in response to the combination of the high and low work functions. For example, forming a first metal layer with a low work function in Step 804 may include using an elementary metal such as W, Ti, Ta, or binary metals such as Ta—N or Ti—N. Forming a second metal layer with a high work function in Step 806 may include using an elemental metal such as Ir, Pt, or Cu, or binary metals such as W—N or Ti—N.

Alternately, forming a first metal layer in Step 804 includes the first metal having a high work function, using an elemental metal such as Ir, Pt, or Cu, or binary metals such as W—N or Ti—N. Forming a second metal layer in Step 806 includes the second metal having a low work function, using an elementary metal such as W, Ti, or Ta, or binary metals such as Ta—N or Ti—N. Then, establishing a gate work function in Step 808 includes establishing a gate work function in response to the combination of the high and low work functions.

In some aspects of the method, forming a second metal layer having a second thickness overlying the first metal layer in Step 806 includes substeps. Step 806a deposits the second metal to an initial thickness, greater than the second thickness. Step 806b removes a layer of the second metal thickness, equal to the initial thickness minus the second thickness, by a process such as chemically etching or chemical mechanical polishing (CMP).

In other aspects, forming a first metal layer having a first thickness overlying the first metal layer in Step 804 includes substeps. Step 804a deposits the first metal to an initial thickness, greater than the first thickness. Step 804b removes a layer of the first metal thickness, equal to the initial thickness minus the first thickness, by a process such as chemically etching or CMP.

Figure 9:
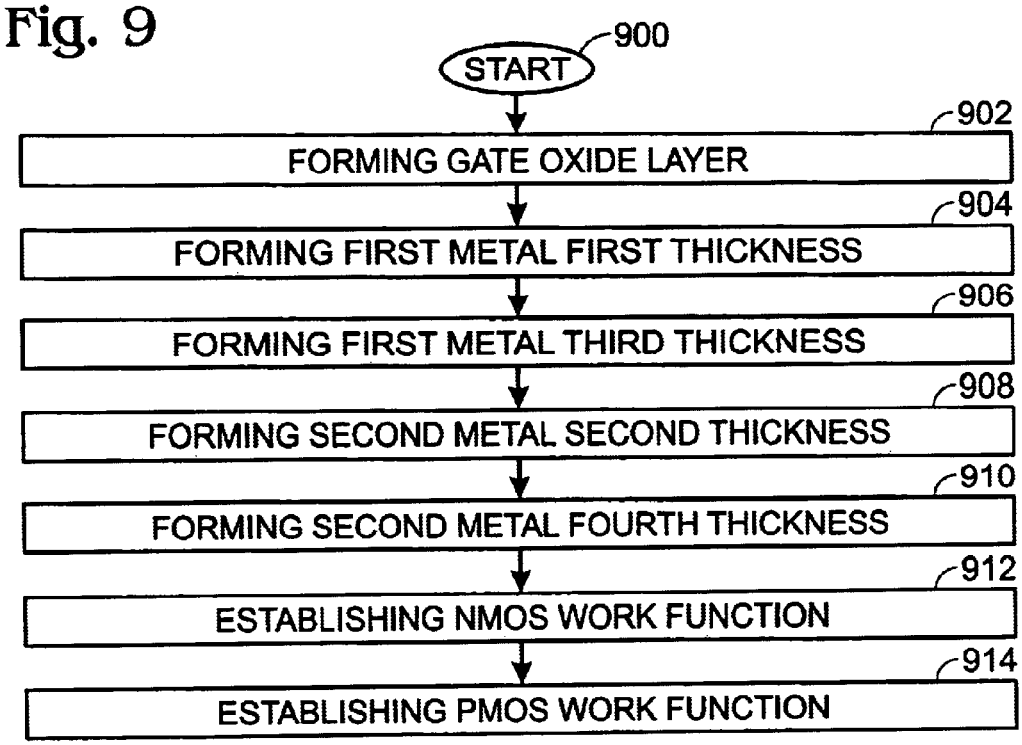
FIG. 9 is a flowchart illustrating the present invention method for setting threshold voltage in a dual-gate MOSFET with gate metal stacks.

FIG. 9 is a flowchart illustrating the present invention method for setting threshold voltage in a dual-gate MOSFET with gate metal stacks. Step 900 is the start. Step 902 forms a gate oxide layer overlying NMOS and PMOS channel regions. Step 904 forms a first metal layer having a first thickness overlying the NMOS gate oxide layer. Step 906 forms a first metal layer having a third thickness overlying the PMOS gate oxide layer. Step 908 forms a second metal layer having a second thickness overlying the first metal layer first thickness. Step 910 forms a second metal layer having a fourth thickness overlying the first metal layer third thickness. Step 912 establishes an NMOS gate work function in response to the combination of the first metal first thickness and the second metal second thickness. Step 914 establishes a PMOS gate work function in response to the combination of the first metal third thickness and the second metal fourth thickness.

In some aspects, forming a first metal layer having a third thickness overlying the PMOS gate oxide layer in Step 906 includes substeps (not shown). Step 906a deposits the first metal to the first thickness. Step 906b etches the first metal to the third thickness. For example, the first thickness may be thicker than the third thickness to differentiate the NMOS and PMOS gate work functions. For example, in some aspects Step 906b may etch the first metal to a third thickness equal to zero. In other circumstances, the first thickness may be less than the third thickness, or the first thickness may equal the third thickness.

In some aspects, establishing an NMOS gate work function in response to the combination of the first metal first thickness and the second metal second thickness in Step 912 includes establishing a work function substantially in response to the first metal first thickness, for example, when the first thickness is relatively thick (as defined above). In some aspects, establishing a PMOS gate work function in response to the combination of the first metal third thickness and the second metal fourth thickness in Step 914 includes establishing a work function substantially in response to the second metal fourth thickness, for example, when the third thickness is relatively thin (as defined above).

Alternately, establishing an NMOS gate work function in Step 912 includes establishing a work function substantially in response to the second metal second thickness (when the first thickness is relatively thin, for example less than 1.5 nm). Establishing a PMOS gate work function in Step 914 includes establishing a work function substantially in response to the first metal third thickness (when the third thickness is relatively thick, for example greater than 20 nm).

In some aspects of the method, forming a first metal layer overlying the NMOS and PMOS gate oxide layers in Step 904 and 906 includes the first metal having a low work function, using an elementary metal such as W, Ti, or Ta, or binary metals such as Ta—N or Ti—N, for example. Forming a second metal layer overlying the first metal layer in Step 908 and 910 includes the second metal having a high work function, using an elemental metal such as Ir, Pt, or Cu, or binary metal such as W—N or Ti—N, for example.

Alternately, forming a first metal layer overlying the NMOS and PMOS gate oxide layers in Step 904 and 906 includes the first metal having a high work function, and forming a second metal layer overlying the first metal layer in Step 908 and 910 includes the second metal having a low work function. The high and low work functions metals can be as in the above-mentioned example.

In some aspects, forming a first metal layer having a first thickness overlying the NMOS gate oxide layer in Step 904 includes the first thickness being less than about 1.5 nm. Forming a second metal layer having a second thickness overlying the first metal layer in Step 908 includes the second thickness being greater than about 10 nm. Then, establishing an NMOS gate work function in response to the combination of the first metal first thickness and the second metal second thickness in Step 912 includes establishing a gate work function substantially in response to the second metal second thickness.

Likewise, forming a first metal layer having a third thickness overlying the PMOS gate oxide layer in Step 906 includes the third thickness being less than about 1.5 nm. Forming a second metal layer having a fourth thickness overlying the first metal layer in Step 910 includes the second thickness being greater than about 10 nm. Then, establishing a PMOS gate work function in response to the combination of the first metal third thickness and the second metal fourth thickness in Step 914 includes establishing a gate work function substantially in response to the second metal fourth thickness.

In some aspects, forming a first metal layer having a first thickness overlying the NMOS gate oxide layer in Step 904 includes the first thickness being greater than about 20 nm. Then, establishing an NMOS gate work function in response to the combination of the first metal first thickness and the second metal second thickness in Step 912 includes establishing the NMOS gate work function substantially in response to the first metal first thickness. Likewise, when (Step 906) the third thickness is greater than about 20 nm, establishing an PMOS gate work function in response to the combination of the first metal third thickness and the second metal fourth thickness in Step 914 includes establishing the PMOS gate work function substantially in response to the first metal third thickness.

Typically, forming a first metal layer having a first thickness overlying the NMOS gate oxide layer in Step 904 includes forming a first thickness in the range between 0 and 20 nm. Likewise, forming a first metal layer having a third thickness overlying the PMOS gate oxide layer in Step 906 includes forming a third thickness in the range between 0 and 20 nm.

Stacked metal gate MOSFET devices and associated fabrication processes have been presented above. For full CMOS applications, where the metal stack for the NMOS-FET is different from the PMOSFET, the first metal layer is typically deposited over the entire wafer surface. Then, patterning and etching steps are performed. Since the first (lower) metal layer is extremely thin, on the order of 10 nm, it can be etched easily by either a wet or dry process. If the first metal layer has been completely etched away, the transistor simply uses the second metal gate material as its gate.

Examples have been given of various gate metals and first and second gate metal combinations. However, the invention is not limited to simply these examples. Further, examples have been given using only metal gate materials. The invention can also be enabled using other materials, or combinations of metals with other materials. For example, the first layer may be a metal and the second layer polysilicon. Other variations and embodiments of the invention will occur to those skilled in the art.

We claim:

1. A MOSFET with a dual metal gate comprising:
    a silicon channel region;
    a gate oxide layer overlying the channel region;
    a gate including:
        a first metal layer having a first thickness of less than 1.5 nanometers (nm) overlying the gate oxide layer;
        a second metal layer, non-diffused with the first metal layer, having a second thickness of greater than 10 nm overlying the first metal layer; and,
    a gate work function substantially responsive to the second metal second thickness.

2. The MOSFET of claim 1 wherein the first metal has a low work function; and,
    wherein the second metal has a high work function.

3. The MOSFET of claim 2 wherein the first metal is a material selected from the group including elementary metals such as W, Ti, Ta, and binary metals such as Ta—N and Ti—N; and, wherein the second metal is a material selected from the group including elemental metals such as Ir, Pt, and Cu, and binary metals such as W—N and Ti—N.

4. The MOSFET of claim 1 wherein the first metal has a high work function; and, wherein the second metal has a low work function.

5. The MOSFET of claim 4 wherein the first metal is a material selected from the group including elemental metals such as Ir, Pt, and Cu, and binary metals such as W—N and Ti—N; and, wherein the second metal is a material selected from the group including elementary metals such as W, Ti, Ta, and binary metals such as Ta—N and Ti—N.

6. A dual-gate MOSFET with metal gate stack comprising:

gate oxide layers overlying NMOS and PMOS channel regions;

a first metal layer having a first thickness overlying the NMOS gate oxide layer;

a second metal layer, non-diffused into the first metal layer, having a second thickness overlying the first metal layer first thickness;

a first metal layer having a third thickness overlying the PMOS gate oxide layer;

a second metal layer, non-diffused into the first metal layer, having a fourth thickness overlying the first metal layer third thickness;

an NMOS gate work function substantially responsive to the first metal first thickness; and, a PMOS gate work function substantially responsive to the second metal fourth thickness.

7. The MOSFET of claim 6 wherein the first metal has a low work function; and, wherein the second metal has a high work function.

8. The MOSFET of claim 7 wherein the first metal is a material selected from the group including elementary metals such as W, Ti, Ta, and binary metals such as Ta—N and Ti—N; and, wherein the second metal is a material selected from the group of elemental metals such as Ir, Pt, Cu, and binary metal such as W—N and Ti—N.

9. The MOSFET of claim 6 wherein the first metal has a high work function; and, wherein the second metal has a low work function.

10. The MOSFET of claim 9 wherein the first metal is a material selected from the group of elemental metals such as Ir, Pt, Cu, and binary metal such as W—N and Ti—N; and, wherein the second metal is a material selected from the group including elementary metals such as W, Ti, Ta, and binary metals such as Ta—N and Ti—N.

11. The MOSFET of claim 6 wherein the first metal layer third thickness is less than about 1.5 nanometers (nm); and, wherein the second metal layer fourth thickness is greater than about 10 nm.

12. The MOSFET of claim 6 wherein the first metal layer first thickness is greater than about 20 nm.

13. The MOSFET of claim 6 wherein the first metal layer first thickness is in the range between 0 and 20 nm; and, wherein the first metal layer third thickness is in the range between 0 and 20 nm.

14. A dual-gate MOSFET with metal gate stack comprising:

gate oxide layers overlying NMOS and PMOS channel regions;

a first metal layer having a first thickness overlying the NMOS gate oxide layer;

a second metal layer, non-diffused into the first metal layer, having a second thickness overlying the first metal layer first thickness;

a first metal layer having a third thickness overlying the PMOS gate oxide layer;

a second metal layer, non-diffused into the first metal layer, having a fourth thickness overlying the first metal layer third thickness;

an NMOS gate work function substantially responsive to the second metal second thickness; and, a PMOS gate work function substantially responsive to the first metal third thickness.

15. The MOSFET of claim 14 wherein the first metal has a low work function; and, wherein the second metal has a high work function.

16. The MOSFET of claim 15 wherein the first metal is a material selected from the group including elementary metals such as W, Ti, Ta, and binary metals such as Ta—N and Ti—N; and, wherein the second metal is a material selected from the group of elemental metals such as Ir, Pt, Cu, and binary metal such as W—N and Ti—N.

17. The MOSFET of claim 14 wherein the first metal has a high work function; and, wherein the second metal has a low work function.

18. The MOSFET of claim 17 wherein the first metal is a material selected from the group of elemental metals such as Ir, Pt, Cu, and binary metal such as W—N and Ti—N; and, wherein the second metal is a material selected from the group including elementary metals such as W, Ti, Ta, and binary metals such as Ta—N and Ti—N.

19. The MOSFET of claim 14 wherein the first metal layer first thickness is less than about 1.5 nanometers (nm); and, wherein the second metal layer second thickness is greater than about 10 nm.

20. The MOSFET of claim 14 wherein the first metal layer third thickness is greater than about 20 nm.

21. The MOSFET of claim 14 wherein the first metal layer first thickness is in the range between 0 and 20 nm; and, wherein the first metal layer third thickness is in the range between 0 and 20 nm.

22. A MOSFET with a dual metal gate comprising:

a silicon channel region;

a gate oxide layer overlying the channel region;

a gate including:

a first metal layer having a first thickness of greater than 20 nanometers (nm) overlying the gate oxide layer;

a second metal layer, non-diffused with the first metal layer, having a second thickness overlying the first metal layer; and, a gate work function substantially responsive to the first metal second thickness.

23. The MOSFET of claim 22 wherein the first metal has a low work function; and, wherein the second metal has a high work function.

24. The MOSFET of claim 23 wherein the first metal is a material selected from the group including elementary metals such as W, Ti, Ta, and binary metals such as Ta—N and Ti—N; and, wherein the second metal is a material selected from the group including elemental metals such as Ir, Pt, and Cu, and binary metals such as W—N and Ti—N.

25. The MOSFET of claim 22 wherein the first metal has a high work function; and, wherein the second metal has a low work function.

26. The MOSFET of claim 25 wherein the first metal is a material selected from the group including elemental metals such as Ir, Pt, and Cu, and binary metals such as W—N and Ti—N; and, wherein the second metal is a material selected from the group including elementary metals such as W, Ti, Ta, and binary metals such as Ta—N and Ti—N.

* * * * *